United States Patent [19]

Sajja et al.

[11] Patent Number: 4,589,962

[45] Date of Patent: May 20, 1986

[54] SOLDER PLATING PROCESS AND SEMICONDUCTOR PRODUCT

[75] Inventors: Vijay M. Sajja, Fremont; Ranjan Mathew, San Jose; Jagdish Belani, Cupertino, all of Calif.

[73] Assignee: National Semiconductor Corporation, Santa Clara, Calif.

[21] Appl. No.: 740,170

[22] Filed: Jun. 3, 1985

[51] Int. Cl.[4] .......................... C25D 5/02; C25D 5/34
[52] U.S. Cl. ..................................... 204/15; 204/32.1
[58] Field of Search ................................. 204/15, 32.1

[56] References Cited

U.S. PATENT DOCUMENTS 3,427,232  2/1969  Natwick ............................. 204/32.1
4,163,700  8/1979  Igarashi et al. ....................... 204/43

OTHER PUBLICATIONS

Tech Specs (LeaRonal) TechSpec No. 47400-TS Aug. 8, 1983, 8 pages.

*Primary Examiner*—T. M. Tufariello
*Attorney, Agent, or Firm*—Michael J. Pollock; Paul J. Winters; Gail W. Woodward

[57] ABSTRACT

A method for solder plating metal leads in plastic semiconductor packages comprises cleaning the leads followed by electroplating tin or a tin/lead alloy onto the leads. The cleaning is effected with a non-corrosive solution which is either a carboxylic acid, a hydroxycarboxylic acid, or a combination of both. The electroplating solution is a sulfonic acid or citric acid based system, including suitable tin salts and/or lead salts. A sequestering agent may be used to inhibit the corrosive effect of the electroplating bath.

9 Claims, No Drawings

SOLDER PLATING PROCESS AND SEMICONDUCTOR PRODUCT

BACKGROUND OF THE INVENTION

1. Field of the Invention

The present invention relates generally to the packaging of integrated circuits and other semiconductor products in plastic packages having a plurality of exposed metal leads. More particularly, the invention relates to an improved method for solder coating the leads to provide protection and allow for soldering the leads to a printed circuit board.

In packaging semiconductor devices, the integrated circuit (usually referred to as a chip or die) is connected to a plurality of metal leads, typically by either wire bonding techniques or tape automated bonding. After such connection, the die is encapsulated in either a plastic or ceramic package which protects the die and defines what will be referred to hereinafter as the semiconductor package. The present invention relates particularly to plastic semiconductor packages.

The metal leads, which are typically copper or a copper alloy project from the semiconductor package and may be connected to other circuitry by conventional soldering techniques. Copper, however, cannot be directly soldered and it is necessary to first coat the leads with a thin layer of tin or a tin/lead alloy to provide solderability.

Heretofore, two primary methods for coating the metal leads have been employed, both of which are applied to the semiconductor package after encapsulation is complete. The first method relies on dipping the semiconductor package in molten tin or tin/lead alloy for a brief period, typically 1 to 10 seconds. While this method is reasonably effective, the high temperature of the molten metal, typically from about 230° C. to 260° C., places severe thermal stress on the package and can cause gaps around the leads to develop in plastic package. Moreover, the solder coat applied to the leads often has a non-uniform thickness which can interfere subsequent manipulation of the device, particularly automatic insertion onto printed circuit boards.

The other method for coating a solder layer onto the metal leads relies on electroplating in a suitable plating bath. To accomplish such electroplating, the packages are first cleaned, typically with a strong mineral acid such as hydrochloric acid, sulfuric acid, nitric acid, phosphoric acid, and the like. The plating electrolytes utilized typically consisted of corrosive acids, and tin/lead salts. For example, when coating pure tin, sulfuric acid based electrolytes were used. For coating tin/lead alloys, fluoboric acid based electrolytes were used. Alternatively, alkane/alkanol sulfonic acid based electrolytes were used.

The present invention addresses a problem which has been recognized by the inventors herein. When electroplating solder on plastic semiconductor packages, severe corrosion of the aluminum metallization on the semiconductor die can result if the package has small gaps between the plastic encapsulation material and the metal leads. Such gaps allow the corrosive cleaning solution and plating electrolyte to penetrate the plastic body of the semiconductor package. Once the corrosive materials have entered, subsequent rinsing and cleaning of the packages are often not effective to remove it. Even very small amounts of corrosive material left on the aluminum metallization for long periods of time can result in corrosion of the aluminum and present potential failure problems for the package.

It would therefore be desirable to provide methods for solder plating the metal leads of plastic semiconductor device packages in such a manner that corrosion of the metallization layers is largely avoided.

2. Description of the Prior Art

U.S. Pat. No. 4,163,700 discloses an electroplating bath for tin or tin alloys which includes tin salts, such as tin citrate, dissolved in a citric acid solution. The plating bath further includes a hydroxycarboxylic acid (other than citric acid or citrate) and/or a dibasic carboxylic acid. LeaRonal, Inc., Freeport, N.Y., sell an electroplating system for plating tin and/or tin alloys on various metals. The system is sold under the trade name "Solder On SG" and comprises tin and lead salts in a sulfonic acid based system. A sequestering agent (Solder On SG Make-up) of unidentified composition is included in the electroplating system. LeaRonal, Inc. recommends that their system be used on ceramic semiconductor packages, where the metal leads are cleaned with a strong mineral acid, such as sulfuric acid, prior to electroplating.

SUMMARY OF THE INVENTION

The present invention provides a method for solder plating metal leads on plastic semiconductor packages, which method employs non-corrosive cleaning and electroplating solutions to avoid damage to the metal leads and encapsulated semiconductor die even when small gaps exist in the plastic package. The method comprises two steps, where the first step is the cleaning of the metal leads the semiconductor package using an organic acid selected from carboxylic acids and hydroxycarboxylic acids. The second step is electroplating the leads with solder in a non-corrosive plating solution.

In the preferred embodiment, the organic acid in the cleaning solution is either citric acid, oxalic acid, or a combination of either of these acids with another organic acid, and the cleaning is performed at an elevated temperature. The electroplating solution includes an alkanol/alkane tin salt, or tin salt and an alkanol/alkane lead salt, in a non-corrosive plating bath, where the relative amounts of tin and lead depend on the desired composition of the solder plate. The metal salts are present in either sulfonic acid or citric acid. The sulfonic acid plating bath includes a tin alkylsulfonic salt and/or a lead alkylsulfonic salt, and a sequestering agent to inhibit attack of the fluoboric acid on the aluminum. In the citric acid based system, tin citrate and/or lead citrate are dissolved in the citric acid. Plating is carried out in conventional apparatus to apply the desired thickness of the solder to the lead frame.

DESCRIPTION OF THE PREFERRED EMBODIMENT

The method of the present invention is useful for solder plating metal leads on plastic semiconductor packages, such as conventional dual-in-line packages which are used throughout the microelectronics industry. Semiconductor dies are mounted on lead frames and encapsulated in plastic to protect the semiconductor die and facilitate mounting. The lead frames are usually composed of copper, a copper alloy, or a nickel-iron alloy and include a plurality of individual leads which extend outward from the plastic package. The leads are usually soldered to printed circuit boards. In order to protect the leads and enable them to be soldered to printed circuit boards or other devices, it is desirable to coat the leads with a layer of tin or tin/lead alloy.

The present invention is a method for electroplating the tin or tin/lead alloy onto the leads which extend from the semiconductor package at a time after the package encapsulation is complete. The method utilizes non-corrosive cleaning solutions and plating solutions so that exposure of the metallization layer on the semiconductor die to these solutions will not result in damage.

The cleaning solution comprises a mild organic acid selected from carboxylic acids and hydroxycarboxylic acids. By employing the acid cleaning solution at a mildly elevated temperature, the leads will be cleaned, but any residual acid which penetrates the package through small gaps or interstices in the package will not corrode the aluminum metallization on the semiconductor die. The problem with prior art cleaning solutions, which typically had been strong mineral acids, such as sulfuric acid, nitric acid, and the like, was that any acid which penetrated the package could not be washed away. Thus, these acids remained in the package for extended periods and were likely to cause great damage.

The carboxylic acids useful in the cleaning solution of the present invention include oxalic acid, malonic acid, succinic acid, glutaric acid, and the like. Suitable hydroxycarboxylic acids include citric acid, tartaric acid, malic acid, lactic acid, ascorbic acid, and the like. These acids will typically be employed at a concentration in the range from about 10 to 200 g/l, more typically in the range from about 100 to 150 g/l. Exposure will be at a temperature in the range from 25° to 100° C., and for a time in the range from 1 to 20 minutes.

Care must be taken with both the carboxylic acid cleaning solutions and the hydroxycarboxylic acid cleaning solutions to make sure that the solutions are fresh and to change the solutions when they become laden with heavy metals, such as copper. Copper and other metals will redeposit on the leads and interfere with the plating of the solder.

The electroplating solution for depositing the solder layer, either tin or a tin/lead alloy, on the aluminum leads is also non-corrosive. Two electroplating systems have been found suitable for the present invention. The first of these systems is a sulfonic acid based electrolyte while the second system is a citric acid based electrolyte. A sequestering agent is utilized with the sulfonic acid based electrolyte to further inhibit corrosion of the aluminum surface.

The sulfonic acid plating system typically utilizes a tin alkane/alkanol sulfonate salt and/or a lead alkane/alkanol sulfonate salt, where an alkane or alkanol radical has from 1 to 6 carbon atoms, more usually from 1 to 3 carbon atoms. The concentrations of these salts will vary depending on the desired ratio of tin to lead and the solder plate, typically being in the range from 5 to 100 g/l, more typically being in the range from 5 to 100 g/l. For achieving a tin/lead solder having a ratio of tin:lead of 90:10, a suitable plating solution would have approximately 25 g/l tin alkane sulfonate and 5 g/l (excess) lead alkane sulfonate. Conveniently, tin methane sulfonate and lead methane sulfonate may be utilized as the salts. The concentration of the sulfonic acid is typically in the range from 5 to 30% by volume, more typically being in the range from 10 to 20% by volume.

The sulfonic acid based electrolyte will include a sequestering agent selected to inhibit acid attack by the electrolyte on the aluminum and other components internal to the semiconductor package. Suitable sequestering agents include sodium metasilicate and Solder On SG Make-up available from LeaRonal, Inc., as part of their Solder On SG system. These sequestering agents are typically utilized at the concentration in the range from 1 to 50 g/l, more typically in the range from 5 to 30 g/l.

The citric acid plating solution typically includes a tin sulfonate salt and/or a lead sulfonate salt, at concentrations selected to yield the desired tin/lead ratio in the solder plate. Typically, the tin sulfate salt will be present at a concentration in the range from about 5 to 100 g/l, while the lead sulfate will be present in the range from about 1 to 50 g/l. Concentrations suitable for producing a 90% tin alloy would be 25 g/l tin sulfate and 5 g/l lead sulfate. The concentration of the citric acid is not critical, typically being in the range from about 10% to 100%. By adjusting the pH of the citric acid electrolyte to a value in the range from about 6 to 7, typically with $NA_4OH$, it has been found that the electrolyte will be substantially non-corrosive to the aluminum metallization.

The plating method of the present invention may be performed in conventional electroplating equipment. The plating tank should be made of an acid resistant material, such as an acid-resistant polymer, e.g., polypropylene, polyvinylchloride, or the like. Plating racks are provided internal to the plating tank, and a suitable power supply is utilized to provide the necessary plating current. The anode is typically a tin/lead alloy having a tin/lead ratio which matches the desired composition of the solder plate. The cathode is connected to the plating rack, and the plating power supply is run at a low voltage, typically from 1 to 20 volts, usually about 3 volts, for a time sufficient to supply the desired thickness of solder plate. The thickness will usually be in the range from about 0.3 to 2 mils. The amount of current required will depend on the number of packages being plated and on the amount of time allowed for the plating process. Generally, a higher current will correspond to a shorter plating time.

The following examples are offered by way of illustration, not by way of limitation.

EXPERIMENTAL

1. Corrosive Effect of Plating Baths on Metallization Layers on Silicon Dies

Silicon dies having exposed aluminum metallization layers were immersed in the plating solutions listed in Table 1 and microscopically examined for corrosion after 5 minutes, 24 hours, 55 hours, 80 hours, and 100 hours. The sequestering agent employed was either "Solder On SG Make-up" sequestering agent from LeaRonal, Inc. Freeport, N.Y., or sodium metasilicate.

TABLE 1

| Sample No. | Plating Solution | Sequestering Agent | Extent of Corrosion | | | | |
|---|---|---|---|---|---|---|---|
| | | | 5 Min. | 24 hr. | 55 hr. | 80 hr. | 100 hr. |
| 1 | Stannous Sulfonate; | None | 100% | — | — | — | — |

TABLE 1-continued

| Sample No. | Plating Solution | Sequestering Agent | Extent of Corrosion | | | | |
|---|---|---|---|---|---|---|---|
| | | | 5 Min. | 24 hr. | 55 hr. | 80 hr. | 100 hr. |
| 2 | 10% H$_2$SO$_4$ Stannous Fluoborate (15 g/l); Lead Fluoborate (10 g/l); 40% Fluoboric acid | None | 100% | — | — | — | — |
| 3 | Stannous Sulfonate; (25 g/l); Lead Sulfonate (5 g/l); Citric Acid | None | 0 | 0 | 0 | 0 | 0 |
| 4 | Stannous alkane sulfonate (25 g/l); Lead alkane sulfonate (5 g/l); 20% Methane sulfonic acid | None | 0 | 15% | 100% | 100% | 100% |
| 5 | Same as Sample 4 | 5% Make-up | 0 | 0 | 0 | 0 | 15% |
| 6 | Same as Sample 4 | 20% Make-up | 0 | 0 | 0 | 0 | 0 |
| 7 | Same as Sample 4 | 1 g/l sodium metasilicate | 0 | 0 | — | — | — |

2. Corrosion Inhibition Effect of Sequestering Agent

Silicon dies having exposed aluminum metallization layers were immersed in the plating solutions given in Table 2. The corrosion occurring after 24 hours, 55 hours, and 103 hours was visually assessed under a microscope, and the results are noted.

TABLE 2

| Sample No. | Tin sulfonate salt (g/l) | Lead sulfonate salt (g/l) | Wetting agent (% vol.) | Sequestering Agent$^a$ (% vol.) | DI Water (% vol.) | Extent of Corrosion | | |
|---|---|---|---|---|---|---|---|---|
| | | | | | | 24 hr. | 55 hr. | 103 hr. |
| 1 | 30 | 0 | 0 | 0 | 75 | 7% | 100% | 100% |
| 2 | 0 | 9 | " | " | 98 | 0 | 100% | 100% |
| 3 | " | 0 | 20 | " | 80 | 0 | 0 | 0 |
| 4 | " | " | 0 | 20 | " | " | " | " |
| 5 | 24 | 9 | 20 | " | 38 | " | " | " |
| 6 | 30 | 7.2 | " | " | 33.5 | " | " | " |
| 7 | 27.5 | 8.6 | 0 | 0 | 75 | 7% | 100% | 100% |
| 8 | " | " | 5 | " | 70 | 0 | 0 | 7% |
| 9 | " | " | 10 | " | 65 | 0 | 0 | 0 |
| 10 | " | " | 20 | " | " | 0 | 0 | 0 |
| 11 | " | " | 24 | " | 55 | 0 | 0 | 0 |
| 12 | " | " | 20 | 5 | 50 | 0 | 0 | 0 |
| 13 | " | " | 20 | 20 | 35 | 0 | 0 | 0 |

$^a$Make-up

Although the foregoing invention has been described in some detail by way of illustration and example for purposes of clarity of understanding, it will be obvious that certain changes and modifications may be practiced within the scope of the appended claims.

What is claimed is:

1. A method for solder plating metal leads on a plastic semiconductor package, said method comprising:
   exposing the plastic semiconductor package to an organic acid selected from carboxylic acids and hydroxycarboxylic acids to remove metal oxide from the leads; and
   electroplating tin or a tin/lead alloy onto the metal leads in a non-corrosive electrolyte wherein tin salts or tin and lead salts are present in sulfonic acid or citric acid.

2. A method as in claim 1, wherein the carboxylic acids are selected from the group consisting of oxalic acid, malonic acid, succinic acid, and glutaric acid.

3. A method as in claim 1, wherein the hydroxycarboxylic acids are selected from the group consisting of citric acid, ascorbic acid, malic acid, and lactic acid.

4. A method as in claim 1, wherein the organic acid is at an elevated temperature.

5. A method as in claim 1, wherein the electrolyte is sulfonic acid based and includes a sequestering agent.

6. A method as in claim 1, wherein the electrolyte is citric acid based with a pH in the range from 6 to 7.

7. A method as in claim 1, wherein the plating bath includes tin alkane sulfonate salt or a tin alkane sulfonate salt and a lead alkane sulfonate salt in a sulfonic acid based electrolyte.

8. A method as in claim 1, wherein the electrolyte includes a tin citrate salt or a tin citrate salt and lead citrate salt in a citric acid based electrolyte.

9. Semiconductor packages produced according to the method of claim 1.

* * * * *